United States Patent [19]
Chan et al.

[11] Patent Number: 6,088,206
[45] Date of Patent: Jul. 11, 2000

[54] CLAMP CIRCUIT TO LIMIT OVERDRIVE OF OFF CHIP DRIVER

[75] Inventors: Francis Chan, Williston; Dale E. Pontius, Colchester; Michael A. Roberge, Milton; Endre P. Thoma, Colchester; Minh H. Tong, Essex Junction, all of Vt.

[73] Assignee: International Business Machines Corporation, Armonk, N.Y.

[21] Appl. No.: 09/060,837

[22] Filed: Apr. 15, 1998

[51] Int. Cl.[7] .................................................. H02H 3/20
[52] U.S. Cl. ........................ 361/91.1; 361/110; 326/27
[58] Field of Search ............................... 361/18, 54, 56, 361/91.1, 110; 327/379, 381, 382, 384, 332, 333, 374, 377, 108; 326/26, 27, 82, 83

[56] References Cited

U.S. PATENT DOCUMENTS 5,404,051  4/1995  Kobayashi ........................ 327/170
5,724,218  3/1998  Tihanyi ............................. 361/79

*Primary Examiner*—Ronald W. Leja
*Attorney, Agent, or Firm*—Robert A. Walsh

[57] ABSTRACT

An off-chip driver (OCD) circuit including a clamp circuit to limit overdrive is provided. The circuit comprises an input signal which is inverted to provide an output signal. The driver circuit is comprised of a source-follower transistor to pull-down the output signal. The clamp circuit actively feeds back the source-follower potential to slow down the OCD and minimize ground bounce and noise that causes circuits to fail and signal integrity to be corrupted. The simple drive and clamp circuit is comprised of three transistors, one resistor, and one capacitor. The OCD slew rate is controlled by a current source and provides an output that changes between a positive voltage and ground. The circuit limits dv/dt without using a large resistor as a source follower, hence minimizing the adverse effect on performance.

5 Claims, 2 Drawing Sheets

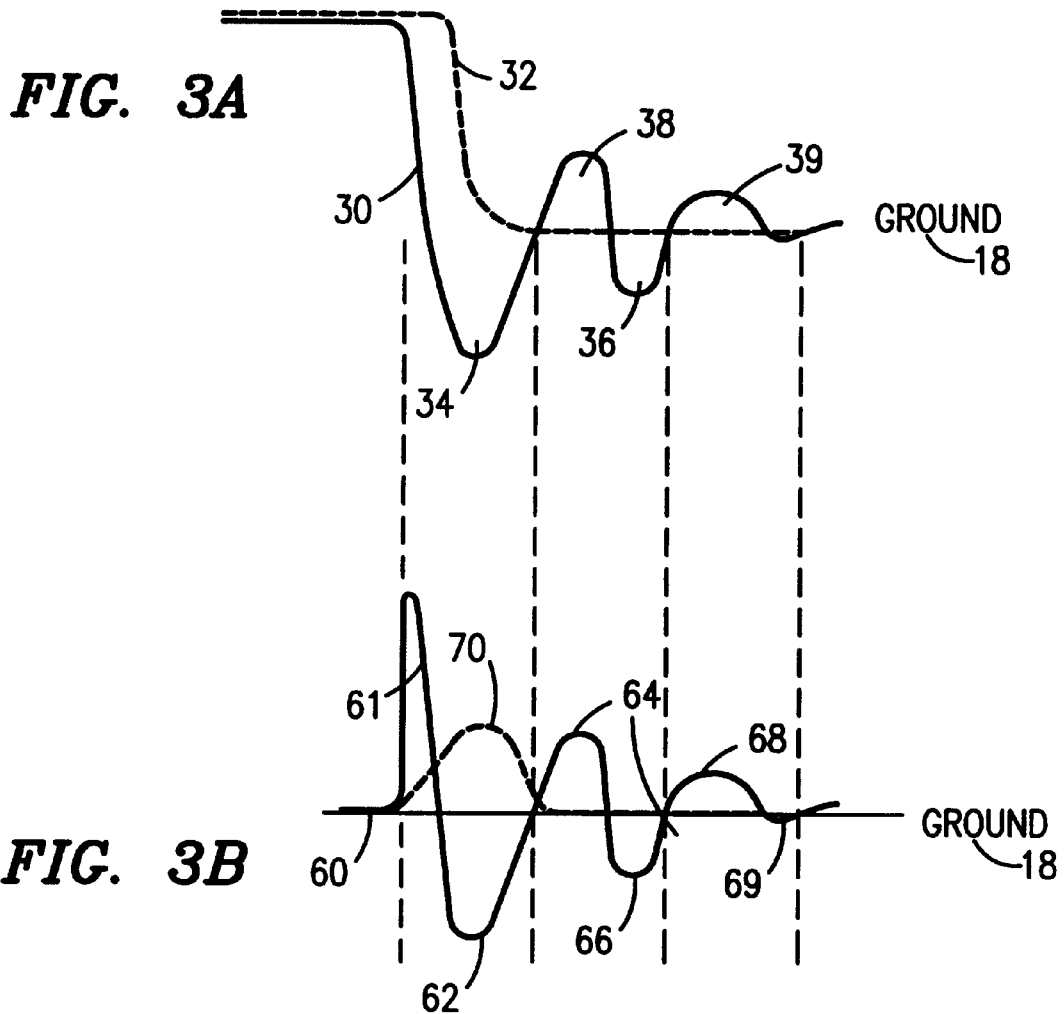

CLAMP CIRCUIT TO LIMIT OVERDRIVE OF OFF CHIP DRIVER

TECHNICAL FIELD OF THE INVENTION

The present invention relates to the circuits used for the design and manufacture of ASIC (Application specific integrated circuit) chips, memory chips and microprocessor chips. More specifically, the present invention relates to the design of an off-chip driver circuit for reducing ground bounce of the output signal.

BACKGROUND OF THE INVENTION

In the design and manufacture of ASIC (application specific integrated circuit) chips, memory chips and microprocessor chips, it is conventional practice to provide the chip designer with a library of conventional circuits from which to generate the design. The circuit designs from which the designer must choose are fixed, and also the rules for interconnecting the circuits by wiring are fixed.

One of the circuit types required by a chip designer is an off-chip driver (OCD) circuit. Usually the chip designer is provided with a plurality of different off-chip driver circuits from which to choose. There is a wide variety of OCD circuits taught in the prior art with each OCD circuit designed to overcome a particular problem. As technologies change and create new problems, new OCD circuits are disclosed to solve the new problems.

The present invention solves the overdrive problem of many of the prior art OCD circuits. OCDs often overdrive an output signal from the ASIC chip and create intolerable levels of ground bounce and noise, causing circuits to fail and corrupting signal integrity. Disclosed is an OCD design which uses precise feedback to the gate of the OCD pull-down transistor to limit the dv/dt and di/dt without using a large resistor as is common for source-follower circuits in the prior art. The disclosed design minimizes the adverse effect on performance. Many of the prior art OCDs are described below.

In U.S. Pat. No. 4,622,482, "Slew Rate Limited Driver Circuit Which Minimizes Crossover Distortion," by Ganger, Ganger teaches a driver circuit which provides an output voltage which is slew rate limited substantially independent of the value of any output load. Ganger's driver is a push-pull driver which uses a pair of transistors of opposite conductivity to drive the output in response to a control signal. Capacitors are utilized to perform slew rate limiting by using a capacitor between each transistor's output and control input. Each transistor is selectively and dynamically biased to insure a substantially linear slew rate. Ganger's driver differs from the present invention in that it is a push-pull driver driving an output between a positive voltage and a negative voltage that provides minimum distortion as the output crosses over from a positive to a negative voltage. The present invention drives the output between a positive voltage and ground and eliminates intolerable levels of ground bounce and noise as the output is driven to ground. In addition, Ganger's driver uses the Miller effect and impedance control of the driver, whereas the present invention does not use the Miller effect.

In U.S. Pat. No. 4,684,824, "Capacitive Load Driver Circuit," by Moberg, Moberg teaches a capacitive load driver which has good response time without cross-conduction. The driver circuit includes a positive drive subcircuit for charging an output load in response to a first input control signal and a negative drive subcircuit for discharging the output load in response to a second control signal. The positive drive subcircuit is used to greatly increase the charging rate during the existence of a predetermined difference between the actual and desired output voltage. The negative drive subcircuit is used to greatly decrease the discharging rate when the discharge exceeds a predetermined value. The output voltage is fed back to detector circuits that make the decisions to boost the positive drive or the negative drive. Moberg's driver differs from the present invention in that it is a push-pull driver driving an output between a positive voltage and ground that uses slew rate feedback and voltage detection circuit, whereas the present invention uses the current output to develop a voltage feedback to the gate electrode of the OCD pull-down device to limit the di/dt and dv/dt. In addition, Moberg's driver is an entirely different circuit that additionally uses positive and negative drive boosters to control slew rate, whereas the present invention is a simpler circuit that does not use Moberg's circuitry containing voltage difference detectors or positive and negative drive boosters.

In U.S. Pat. No. 4,737,667, "Driving Circuitry for a MOSFET Having a Source Load," by Tihanyi, Tihanyi teaches a source-follower circuit for driving a MOS field effect transistor (FET) connected to a load on the source terminal. The source follower is driven by a voltage doubling circuit including two diodes serially connected together. Tihanyi's circuit is a typical prior art driver which uses a large resistance value to slow the turn on of the output pull-down transistor. Tihanyi also uses the typical capacitive feedback between the emitter and gate diode of the driver where the capacitor is also part of the voltage doubling circuitry. Tihanyi's driver differs from the present invention in that it uses a voltage doubling circuit, impedance feedback, and diode control of the input signal, whereas the present invention is a simpler circuit that does not use these features. Tihanyi's capacitor is used as bootstrap drive, whereas the present invention uses its capacitor for level shifting. The present invention, like Tihanyi, uses a source-follower circuit but for the feedback path only.

In U.S. Pat. No. 4,906,867, "Buffer Circuit with Load Sensitive Transition Control," by Petty, Petty teaches a buffer circuit particularly suited for driving the output pad of an integrated circuit. Petty's driver limits the rate of change of current flow in the power supply and ground lines to reduce noise. The circuit features feedback responsive compensation for variations of capacitive load on the pad. The circuit is a composite buffer and output driver which controls the output di/dt through feedback that insures full pull-up of the output stage following transition and controls the turn-on rate of the output transistor to limit the instantaneous current furnished to large capacitive loads. Petty's circuit provides load responsive feedback sensitivity, reduces current surge noise, and ensures concluding DC voltage levels of appropriate magnitudes. The feedback is a capacitor placed between the output and the gate electrode of the driver. Petty differs from the present invention in that it uses the Miller effect and impedance control of the driver, whereas the present invention does not use the Miller effect. Petty uses a buffer circuit, and the present invention does not. The present invention uses a resistor to ground to create and feedback the source-follower potential, whereas Petty does not feedback the source follower potential but instead feeds back the output signal.

In U.S. Pat. No. 5,008,568, "CMOS Output Driver," by Leung et al.,there is taught a driver circuit which uses a transistor configured as a capacitor between the gate and drain of an output pull-down transistor. The purpose is to limit the ground bounce and the rate of change (di/dt) of the current connected through the pull-down transistor during the turn-on of the transistor. Drive for the pull-down transistor is provided in part by a NOR gate, the transistors of which are sized to provide a finite resistance to the pull-down transistor. Additional drive is provided by a transistor connected to function as a resistive pull-up between the gate and the drain of the pull-down transistor. Leung's driver is a push-pull driver which uses a pair of transistors of opposite conductivity to drive the output in response to data and enable input signals. Leung's driver differs from the present invention in that it is a push-pull driver driving an output between a positive voltage and a negative voltage. Leung's driver limits the rate of change of current using a first transistor as capacitor and a second transistor as drive booster. The present invention does not use a push-pull drive, but drives a source-follower output between a positive voltage and ground, while eliminating intolerable levels of ground bounce and noise as the output is driven to ground. The present invention is a simpler circuit that does not use a transistor as a capacitor and does not provide a second transistor and NOR gate to provide the drive from the output circuit. In addition, Leung's driver uses the Miller effect and impedance control of the driver even though the capacitor is implemented using a transistor, whereas the present invention does not use the Miller effect.

In U.S. Pat. No. 5,121,000, "Edge-Rate Feedback CMOS Output Buffer Circuits," by Naghshineh, Naghshineh teaches a CMOS driver circuit that both drives and stores the output value. The CMOS driver provides an output which has a significant reduction in ground bounce. The driver includes an output driver stage, a pull-up pre-driver circuit, a pull-down pre-driver circuit, and feedback means. Naghshineh's driver is a push-pull driver which uses a pair of transistors of opposite conductivity to drive the output in response to both data and enable signals. The feedback means is responsive to the output signal for controlling the rate of rise of the voltage at the gate electrode of the pull-down transistor so as to slow down its turn-on time when the driver output is making a high-to-low transition. A capacitor is utilized on the pull-down transistor to perform slew rate limiting by using a capacitor between the transistor output and the transistors gate electrode. Naghshineh's driver differs from the present invention in that it is a push-pull driver driving an output between a positive voltage and ground that limits the slew rate using a voltage feedback. The present invention uses a simpler and improved circuit that senses the output current rather than the output voltage to establish a feedback voltage.

In U.S. Pat. No. 5,218,239, "Selectable Edge Rate CMOS Output Buffer Circuit," by Boomer, Boomer teaches a driver circuit which controls output signal rise and fall times using a plurality of pull-down pre-driver resistors in parallel. Boomer's driver permits varying the resistor values to select a plurality of different fall times. Boomer's circuit is a typical prior art driver which uses resistance values to slow the turn on of the output pull-down transistor. In symmetrical fashion a plurality of pull-up pre-driver resistors are used in parallel to slow the turn on of the output pull-up transistor. Boomer's driver differs from the present invention in that it is a push-pull driver driving an output between a positive voltage and ground that uses resistor pull-down, whereas the present invention uses feedback to the gate electrode of the OCD pull-down device to limit the di/dt and dv/dt without using a large resistor as a source follower. In addition, Boomer's driver uses the Miller's effect and impedance control of the driver, whereas the present invention does not use a capacitive feedback from the output of the circuit.

In U.S. Pat. No. 5,528,166, "Pulse Controlled Impedance Compensated Output Buffer," by Iikbahar, Iikbahar teaches an improved buffer circuit that uses pulse controlled impedance. The buffer circuit includes two transient drivers which are activated during a portion of the switching time of the output. The two transient drivers are activated for different durations which partially encompass the output transition. The durations act to slow or speed transitions. Iikbahar's driver also includes a feedback circuit which provides impedance compensation by adjusting the total buffer circuit drive. Iikbahar driver differs from the present invention in that it is a push-pull driver driving an output between a positive voltage and ground that uses slew rate feedback and impedance compensation, whereas the present invention uses feedback to the gate electrode of the OCD pull-down device to limit the dv/dt. In addition, Iikbahar's driver is an entirely different circuit that additionally uses two transient drivers to control slew rate, whereas the present invention is a simpler circuit that does not use Iikbahar's circuitry containing two transient drivers.

It is an object of the present invention to provide a clamp circuit for an off-chip driver circuit that actively feeds back the source-follower potential to slow down the OCD and minimize ground bounce and noise that causes circuits to fail and signal integrity to be corrupted.

It is a further object of the present invention to provide a clamp circuit for an off-chip driver circuit that uses feedback to regulate the OCD drive and minimize noise on the output signal.

It is a further object of the present invention to provide a clamp circuit for an off-chip driver circuit that provides precise feedback to the gate of the OCD pull-down transistor to limit dv/dt without using a large resistor as a source follower, hence minimizing the adverse effect on performance.

SUMMARY OF THE INVENTION

In accordance with the invention, an off-chip driver (OCD) circuit including a clamp circuit to limit overdrive is provided. The circuit comprises an input signal which is inverted to provide an output signal. The driver circuit is comprised of a source-follower transistor to pull-down the output signal. The clamp circuit actively feeds back the source-follower potential to slow down the OCD and minimize ground bounce and noise that causes circuits to fail and signal integrity to be corrupted. The input signal is not buffered but feeds directly into both the gate electrode of the driver circuit and the clamp circuit. The simple drive and clamp circuit is comprised of three transistors, one resistor, and one capacitor. The OCD slew rate is controlled by a current source and provides a source-follower output that changes between a positive voltage and ground to limit dv/dt without using a large resistor as a source follower, hence minimizing the adverse effect on performance. The circuit also departs from the traditional impedance feedback, known as the Miller effect, that many of the prior art circuits use.

The advantages of the present invention will become apparent from the following detailed description of the presently preferred embodiment of the invention, taken in conjunction with the accompanying drawings.

BRIEF DESCRIPTION OF DRAWINGS

FIG. 3a is a graphical representation of the OCD voltage transition provided by the conventional off-chip driver as compared to the voltage transition of the output signal according to the present invention.

FIG. 3b is a graphical representation of the ground bounce for conventional OCDs as compared to the present invention.

DETAILED DESCRIPTION OF A PREFERRED EMBODIMENT OF THE INVENTION

In accordance with the invention, an off-chip driver circuit including a clamp circuit to limit overdrive is provided. The circuit comprises an input signal which is inverted to provide an output signal. The driver circuit is comprised of a source-follower transistor to pull-down the output signal. The clamp circuit actively feeds back the source potential of T1 to slow down the OCD and minimize ground bounce.

Figure 1:
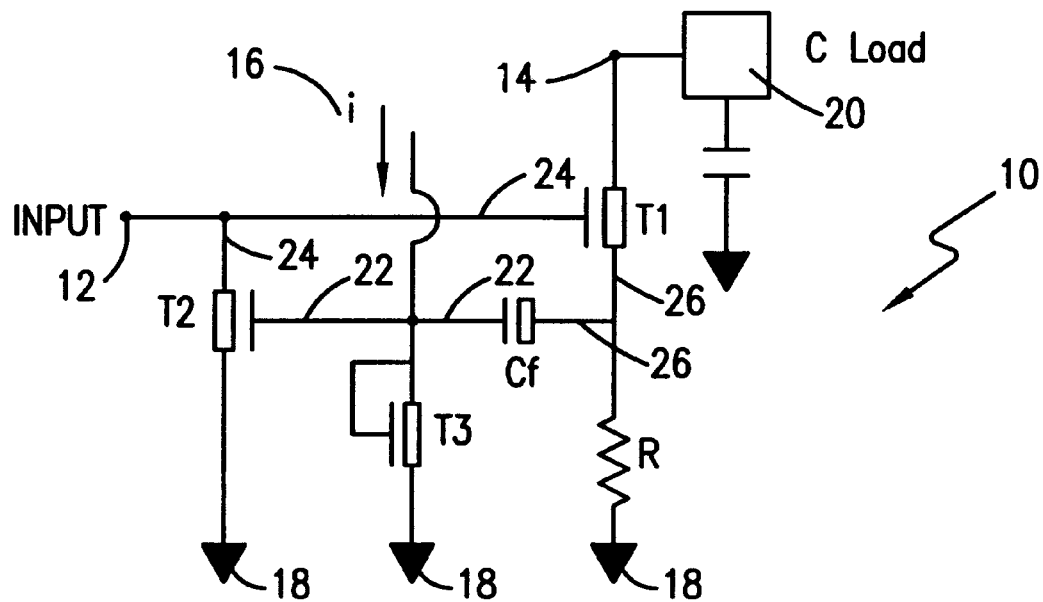
FIG. 1 is a circuit diagram showing the clamp and off-chip driver circuit according to the present invention.

Referring to FIG. 1, there is shown a schematic circuit arrangement of OCD circuit 10 constructed in accordance with the principles of the present invention. Circuit 10 receives input 12 and drives output 14 while receiving energy from current source (I) 16 and also being tied to ground 18. The circuit comprises three field effect transistors (FETs) designated as T1, T2, T3, one resistor (R) and one capacitor (Cf). Circuit 10 receives input 12 and drives output 14, which is inverted from input 12. The input signal 12 is not buffered, but feeds directly into both the gate electrode of FET T1 and the clamp circuit FET T2. Load 20 is representative of the loading on output 14 but is not part of the disclosed OCD circuit 10. FET T1 is the driver, load 20 is a representative loading, and the remainder of the circuitry (T2, T3, R, Cf) comprise the clamp circuit.

Figure 2:
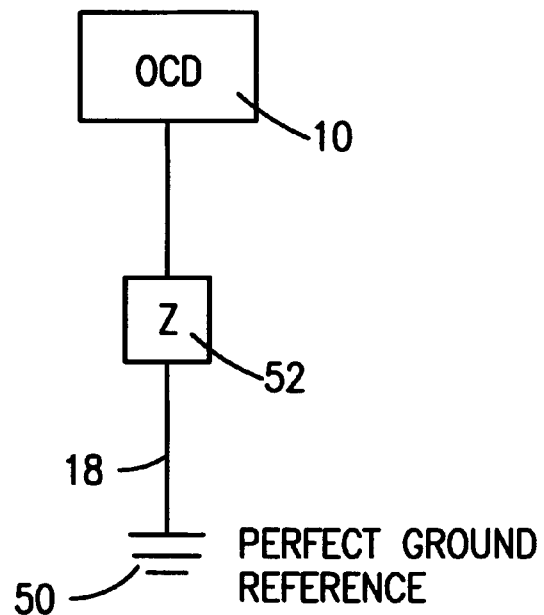
FIG. 2 is a diagram showing the imperfect OCD ground versus a perfect ground reference according to the present invention.

OCD circuit 10 utilizes resistor R in the source of the N-channel pull-down FET T1. One side of resistor R is connected to ground 18 and the source side of resistor R is capacitively coupled through capacitor Cf to the gate electrode of a drive limiting N-channel FET T2. The drain and gate of N-channel FET T3 are connected by wire 22 and cause T3 to function as a diode tied to ground 18. A quiescent bias is established by connecting current source 16 on wire 22, such that FET T2 is barely off. FETs T2 and T3 receive the exact same gate signal on wire 22; however, the threshold voltage of FET T3 is designed to be a little less than the threshold voltage of FET T2. The difference in threshold voltage is accomplished by using a longer integrated circuit device for FET T2 than for FET T3 or is also accomplished by using a low vt device for FET T3 if the technology offers a low vt device. Either way, when input signal 12 rises, it is connected to the gate electrode of FET T1 and turns on FET T1. Input signal 12 must have a source impedance that FET T2 can influence. Referring to FIG. 2, OCD 10 is shown in relation to ground 18 and to perfect ground reference 50. FIG. 2 shows that ground 18 to OCD 10 is an imperfect local ground that exhibits voltage movements due to Z 52, where Z represents parasitic resistances, inductances and capacitances.

Referring to FIG. 1, when the OCD pull-down device T1 turns on, a potential develops across the resistor R, which is coupled to the gate of FET T2 over wire 26 to capacitor Cf to wire 22 and provides voltage feedback. Since FET T2 is biased near its threshold voltage, FET T2 turns on and begins to pull the gate electrode of FET T1 over wire 24 towards ground. Thus, FET T2 turning on reduces the drive to FET T1, which in turn slows down the output transition to output 14. The source-follower potential on wire 26 is actively fed back through capacitor Cf, wire 22, FET T2, and wire 24 to the gate electrode of FET T1. Resistor R need not be large to generate sufficient current feedback to slow down the fall of the output 14 signal.

Referring to FIG. 3a, a pictorial representation is shown of the output waveforms comparing the present invention to conventional OCD drivers. Waveform 30 shows the conventional pull-down OCD driving to ground the output of the driver as represented by waveform 30. However, the conventional OCD overdrives waveform 30 causing overshoot represented by pulses 34, 36, 38, and 39 before the waveform settles out at the ground level. In comparison, the waveform shown by the dashed line 32 represents the present invention that slows down the pull-down slightly and reduces or eliminates the overshoot.

Referring to FIG. 3b, waveforms 60 and 70 are shown in relationship to FIG. 3a and show the difference in ground bounce for conventional OCDs as compared to the present invention. Waveform 60 shows the ground bounce on the conventional pull-down OCD. The conventional OCD has significant ground bounce represented by pulses 61, 62, 64, 66, 68, and 69 before the waveform 60 settles out at the ground 18 level. In comparison, the waveform 70 shown by the dashed line represents the present invention and demonstrates how it minimizes ground bounce.

The advantage of the present invention is to provide a simple clamp circuit for an off-chip driver circuit that actively feeds back the source-follower potential to slow down the OCD and minimize ground bounce and noise that causes circuits to fail and signal integrity to be corrupted.

It is a further advantage of the present invention to provide a clamp circuit for an off-chip driver circuit that uses feedback to regulate the OCD drive and prevent noise on the output signal.

It is a further object of the present invention to provide a clamp circuit for an off-chip driver circuit that provides precise feedback to the gate of the OCD pull-down transistor to limit dv/dt and di/dt without using a large resistor as a source follower, hence minimizing the adverse effect on performance.

It will be appreciated that, although the specific embodiment of the invention has been described herein for purposes of illustration, various modifications may be made without departing from the spirit and scope of the invention.

Accordingly, the scope of protection of this invention is limited only by the following claims and their equivalents.

We claim:

1. An off-chip driver circuit comprising:
   a first N-channel field effect driver transistor having a gate, a source, and a drain;
   input signal means coupled to the gate of said driver transistor for sending a selected signal to the gate of said driver transistor;
   an output connected to said drain of said driver transistor; and
   a clamping circuit for limiting the overdrive of said driver transistor coupled between the source and the gate of said driver transistor for minimizing ground bounce and noise on the output connected to the drain of said driver transistor comprising:
   a current source:
   a resistor with a first connection to ground and a second connection to said source of said first driver transistor for generating a source-follower potential at said source of said first driver transistor during the application of an input signal from said signal means to the gate of said first driver transistor;
   a second N-channel transistor having a gate, a source, and a drain, said gate and drain being interconnected to cause said second transistor to simulate a diode and said source of said second transistor being connected to ground;
   a third N-channel transistor for regulating the output signal of said driver transistor, said third transistor having a gate, a source, and a drain, said source of said third transistor being connected to ground;
   a capacitor with a first connection to said source-follower potential and a second connection to said current source and to the gates of said second and third transistors, and
   a connection from said drain of said third transistor to said input signal means and to said gate of said driver transistor.

2. A feedback regulation circuit for providing regulation for an off-chip N-channel field effect transistor driver having source, and drain connections, and a gate coupled to an input signal source, said feedback regulation circuit being connected to the source of said transistor driver for actively feeding back the potential of the source connection of said off-chip transistor driver, said feedback regulation circuit comprising:

a current source;

transistor driver for inverting and driving said input signal;

a resistor with a first connection to ground and a second connection to the source of said off-chip transistor driver for generating said potential of the source connection of said off-chip transistor driver;

a first N-channel field effect transistor having gate, and drain connections coupled together for simulating a diode and a source connected to ground;

a second N-channel field effect transistor having gate, source, and drain connections for regulating the output of said off-chip transistor driver, said source connected to ground;

a capacitor with a first connection to said potential and a second connection to said gate of said second transistor, to said current source, and to said gate and said drain of said first transistor; and a connection from said drain of said second transistor to said input signal sources and the gate of said off-chip transistor driver.

3. An output slew rate control circuit for providing regulation for an off-chip N-channel field effect transistor driver having source, gate, and drain connections for limiting the dv/dt of the drain of said off-chip transistor driver without using a large resistance connected to the source of said off-chip transistor driver comprising:

an input signal;

a current source;

an output connected to said drain of said off-chip transistor driver;

a resistor connected between ground and the source of said off-chip transistor driver for generating a source-follower potential at said source of said off-chip transistor driver;

a first N-channel field effect transistor having a source connected to ground, a gate and a drain connected together and to the source of the off-chip transistor driver;

a second N-channel field effect transistor having a source connected to ground, agate and a drain connection to the gate of the transistor driver for limiting the dv/dt and di/dt of said off-chip transistor driver; and a capacitor with a first connection to said source-follower potential and a second connection to said gate of said second transistor, to said current source, and to said gate and said drain of said first transistor; and a connection from said drain of said second transistor to said input signal.

4. A circuit comprising:

an input signal means;

an output;

a current source;

first, second and third N-channel field effect transistors each having a gate, a source, and a drain;

the first transistor having its drain connected to said output, its gate coupled to said input signal means and its source connected to ground through a resistor;

the second transistor having a selected threshold voltage, its drain connected to the gate of said first transistor and to said input signal means, its source connected to ground and its gate coupled through a capacitor to the source of said first transistor and through said resistor to ground;

the third transistor having a selected threshold voltage less than the selected threshold voltage of said second transistor, its source connected to ground, its drain connected to its gate and to the gate of said second transistor and through said capacitor to the source of said first transistor and through said resistor to ground; and said current source coupled to the gates of the second and third transistors to establish a quiescence bias on the gate of the second transistor sufficient to hold the second transistor off but insufficient to turn off the second transistor so that when a signal, from the input signal means, turns on the first transistor the current passing through the first transistor causes a source follower voltage to be developed at the junction between the resistor and the source of the first transistor and to be fed back through said capacitor to the gate of the second transistor to turn on said second transistor and pull the gate of the first transistor towards ground to minimize ground bounce and noise at the output.

5. An output slew rate control circuit for the regulation of a driver transistor circuit comprising:

an input signal means;

an output;

a current source:

first, second and third N-channel field effect transistors each having a gate, a source, and a drain;

the first transistor having its drain connected to said output, its gate coupled to said input signal means and its source connected to ground through a resistor;

the second transistor having a selected threshold voltage, its drain connected to the gate of said first transistor and to said input signal means, its source connected to ground and its gate coupled through a capacitor to the source of said first transistor and through said resistor to ground;

the third transistor having a selected threshold voltage less than the selected threshold voltage of said second transistor, its source connected to ground, its drain connected to its gate and to the gate of said second transistor and through said capacitor to the source of said first transistor and through said resistor to ground; and said current source coupled to the gates of the second and third transistors to establish a quiescence bias on the gate of the second transistor sufficient to hold the second transistor off but insufficient to turn off the second transistor so that when a signal, from the input signal means, turns on the first transistor the current passing through the first transistor causes a source follower voltage to be developed at the junction between the resistor and the source of the first transistor and to be fed back through said capacitor to the gate of the second transistor to turn on said second transistor and pull the gate of the first transistor towards ground to minimize ground bounce and noise at the output.

* * * * *